(12) United States Patent
Novikov et al.

(10) Patent No.: US 12,035,425 B1
(45) Date of Patent: Jul. 9, 2024

(54) BI-POLAR TRIAC SHORT DETECTION AND SAFETY CIRCUIT

(71) Applicant: Multitech Medical Devices USA LLC, Holtsville, NY (US)

(72) Inventors: Lenny Novikov, Cliffside Park, NJ (US); John William Weiss, Oakdale, NY (US)

(73) Assignee: Multitech Medical Devices USA LLC, Melville, NY (US)

( * ) Notice: Subject to any disclaimer, the term of this patent is extended or adjusted under 35 U.S.C. 154(b) by 602 days.

(21) Appl. No.: 16/231,445

(22) Filed: Dec. 22, 2018

Related U.S. Application Data

(63) Continuation of application No. 14/775,929, filed as application No. PCT/US2014/027758 on Mar. 14, 2014, now Pat. No. 10,536,991.

(Continued)

(51) Int. Cl.
  *H05B 1/02* (2006.01)
  *H05B 3/00* (2006.01)
  (Continued)

(52) U.S. Cl.
  CPC ......... *H05B 1/0202* (2013.01); *H05B 1/0227* (2013.01); *H05B 1/0252* (2013.01);
  (Continued)

(58) Field of Classification Search
  CPC .. H05B 1/0202; H05B 1/0227; H05B 1/0252; H05B 1/0272; H05B 3/0019; G01R 15/08; G01R 31/42
  See application file for complete search history.

(56) References Cited

U.S. PATENT DOCUMENTS 3,972,471 A * 8/1976 Ziegler .............. G05D 23/1904
  236/46 R
4,316,080 A * 2/1982 Wroblewski ....... G05D 23/2401
  219/494

(Continued)

FOREIGN PATENT DOCUMENTS

CN      102570338 B    7/2012   ........... H02B 13/025
WO      2014152794 A1  9/2014   ............... H05B 1/02

OTHER PUBLICATIONS

Ibrahim, SD Card Projects Using the PIC Microcontroller, 2010, pp. 1-40 (Year: 2010).*

(Continued)

*Primary Examiner* — Shawntina T Fuqua
(74) *Attorney, Agent, or Firm* — BALLON STOLL, P.C.; Grant E. Pollack

(57) ABSTRACT

Disclosed is a temperature control and safety circuit for detecting the temperature of a PTC heating element and the status of a solid state switch powered by an AC power source in both a positive and a negative power voltage half cycle. The AC-powered solid state switch, e.g., a triac, is provided in series with a current sense resistor, the voltage drop across the resistor being proportional to current through the PTC heating element. A voltage shifting circuit is also provided for rendering a positive voltage to an analog to digital converter during both a positive and a negative half cycle. Preferably, the voltage input to the analog to digital converter controls, at least in part, the temperature of the PTC heating element and the status of the AC-powered solid state switch during both of the positive and negative half cycles.

5 Claims, 16 Drawing Sheets

Related U.S. Application Data

(60) Provisional application No. 61/782,714, filed on Mar. 14, 2013.

(51) Int. Cl.
*G01R 15/18* (2006.01)
*G01R 31/42* (2006.01)

(52) U.S. Cl.
CPC ......... *H05B 1/0272* (2013.01); *H05B 3/0019* (2013.01); *G01R 15/18* (2013.01); *G01R 31/42* (2013.01)

(56) References Cited

U.S. PATENT DOCUMENTS

| | | | | |
|---|---|---|---|---|
| 5,323,062 A * | 6/1994 | Crawford | ................... | G05F 1/45 |
| | | | | 327/455 |
| 5,579,192 A | 11/1996 | Lee | ................... | 361/18 |
| 5,861,610 A * | 1/1999 | Weiss | ................ | G05D 23/1917 |
| | | | | 219/505 |
| 6,097,009 A * | 8/2000 | Cole | ...................... | H02H 5/043 |
| | | | | 219/528 |
| 6,355,912 B2 * | 3/2002 | Allard | ................... | H05B 1/0272 |
| | | | | 219/508 |
| 6,680,641 B1 | 1/2004 | Orr | ................... | 327/432 |
| 6,730,887 B2 * | 5/2004 | Horey | ................. | H05B 1/0272 |
| | | | | 219/212 |
| 7,485,832 B2 | 2/2009 | Wang | ........................... | 219/482 |
| 8,383,992 B2 * | 2/2013 | Wang | ................... | H05B 1/0252 |
| | | | | 219/492 |
| 2001/0008236 A1 | 7/2001 | Allard | ........................ | 219/481 |
| 2003/0173345 A1 * | 9/2003 | Irwin, Sr. | ............... | H05B 3/342 |
| | | | | 219/212 |
| 2005/0205549 A1 * | 9/2005 | Crawford | ............ | H05B 1/0288 |
| | | | | 219/494 |
| 2005/0237680 A1 * | 10/2005 | Egner | ..................... | H02H 3/20 |
| | | | | 361/42 |
| 2006/0255746 A1 | 11/2006 | Kumar et al. | ................ | 315/209 |
| 2009/0303642 A1 | 12/2009 | Williams et al. | ................ | 361/42 |
| 2010/0201273 A1 | 8/2010 | Thirugnanasambandham | ........... | |
| | | | | 315/127 |
| 2012/0168407 A1 | 7/2012 | Delfino et al. | ................ | 218/158 |
| 2012/0199574 A1 * | 8/2012 | Weiss | ...................... | H05B 3/56 |
| | | | | 219/481 |
| 2013/0015174 A1 * | 1/2013 | Kohn | .................... | H05B 3/342 |
| | | | | 219/209 |
| 2013/0134149 A1 * | 5/2013 | Weiss | ..................... | H05B 3/146 |
| | | | | 219/481 |
| 2013/0155560 A1 * | 6/2013 | Takeuchi | ............... | H01H 47/00 |
| | | | | 361/89 |
| 2013/0264329 A1 * | 10/2013 | Wang | ................. | G05D 23/1906 |
| | | | | 219/477 |
| 2017/0086281 A1 * | 3/2017 | Avrahamy | ........... | H05B 47/115 |
| 2017/0170824 A1 * | 6/2017 | Du | ......................... | H01H 9/547 |

OTHER PUBLICATIONS

Axotron Crowbar Circuits, 2013 (Year: 2013).*
Supplementary European Search Report and Opinion dated Jan. 23, 2017—regarding EPO Appln. No. 14771160.0.
Written Opinion Of The International Searching Authority dated Jul. 21, 2014—regarding Int'l. Appln. No. PCT/US2014/027758.

* cited by examiner

BI-POLAR TRIAC SHORT DETECTION AND SAFETY CIRCUIT

Cross Reference To Related Application

This Application is a Continuation of U.S. patent application Ser. No. 14/775,929, filed Sep. 14, 2015, that issued as U.S. Pat. No. 10,536,991 on Jan. 14, 2020, which is the U.S. National Stage of International Patent Application No. PCT/US2014/027758, filed Mar. 14, 2014, which is, in turn, based on and claims priority to U.S. Provisional Patent Application Ser. No. 61/782,714, the benefits of which are claimed and the disclosures of which are incorporated by reference herein in their entireties.

CROSS REFERENCE TO RELATED APPLICATION

This application is based on U.S. provisional application Ser. No. 61/782,714 filed Mar. 14, 2013.

FIELD OF THE DISCLOSURE

This disclosure relates generally to electrical safety and, more particularly, to circuits for AC operated appliances, for example, though not limited to, heating pads and electric blankets, that use solid state switching circuits to activate a load and assure the integrity of a solid state switching circuit for controlling activation of the load.

BACKGROUND OF THE DISCLOSURE

Heating pads and electric blankets commonly use heating elements powered by AC line voltage, where the temperature of the heating elements is controlled, and the safety continuously monitored, to protect against overheating. Typically, power to the heating element of such devices is switched on by a solid state switch, e.g., a triac. The integrity of the triac is a key factor in the safety of the product. Should a triac fail in a shorted condition, continuous heating and, in turn, overheating can result, with the risk not only of exposure to the user causing him/her to possibly suffer burns, but also the chance of a fire. It is, therefore, important to detect a shorted power switch condition and disconnect the power before allowing an unsafe condition to develop.

Using multiple circuits in a heating element of a heating pad or electric blanket, it has been found, provides better detection of overheating due to a larger portion of the heating wire being affected by a bunch condition. In this manner, overheating can often be recognized sooner by the temperature control circuitry.

U.S. Pat. No. 5,420,397 to Weiss, for instance, discloses a safety circuit for a positive temperature coefficient (PTC) heater wire that detects a break in the wire, and quickly turns the power off before an arc can cause the wire, which is highly flammable, to catch fire. The circuit uses a triac to switch the power on and off in time proportion relative to the heat setting. In one embodiment, two triacs are used in series to mitigate the effect of one of the triacs failing by becoming shorted, inasmuch as the other of the two triacs would disrupt the power. In another embodiment, a second triac is used in a crowbar circuit to open the power fuse in the event that power to the PTC wire is detected during the "off" state of the power control triac.

Heating pads and electric blankets usually have higher wattage than is needed to stabilize at the desired temperature. The extra power is typically provided to quickly bring the surface of the heating pad or electric blanket up to the desired temperature. Such is termed a "preheat mode" which drives the heater wire to a higher temperature for a short period of time. After cessation of the preheat mode, a controller measures the temperature and maintains the wire at a target temperature according to a setting selected by the user. In this case, the power required to maintain the desired temperature may be as little as 20% of the total available power. A solid state switch, commonly a triac, can fail by becoming shorted in either a full wave or half wave condition. Even a failure in the half wave condition could continuously provide 50% of the power and eventually result in overheating of the heating element. While attempts have been made to detect a triac short in the positive half cycle only, such, it has been found, often leave the circuit vulnerable to a situation where the triac may be shorted in the negative half cycle, and a runaway temperature could result.

Appliances other than heating pads and electric blankets have heating elements powered from an AC line and use triacs to switch the power on and off to control temperature by connecting the heating element to AC power when the temperature is below a preset value, and disconnecting the heating element from the AC power when the required temperature is reached. Other types of AC operated appliances use electronic AC switches to operatively connect and disconnect power to the load. Failure resulting from a shorted electronic power switch (e.g., a triac) in such appliances can also lead to an unsafe and uncontrollable temperature rise in the heating element, or other unsafe conditions.

In microcontroller (MCU) based circuits, an MCU is used to measure temperature of the heater wire and provide a control signal for the triac. These MCU circuits are quite often powered by a non-isolated low voltage power supply connected to the power line, providing just a single polarity DC voltage, e.g., +5V. Having a single polarity power supply provides obstacles for direct detection of the opposite polarity or bipolar signals.

In situations where a heating pad (or other appliances having a heating element powered from an AC line) is used, it has been found advantageous to use two circuits, where one circuit is powered by the positive half cycle of the AC power line, typically 120_VAC, and the other circuit is powered by the negative half cycle of the AC power line, as described in U.S. Patent Application Publication No. US 2013/0134149 A1 to Weiss. Heating elements typically used have positive temperature coefficient characteristics, for example, when nickel is used, and the temperature is determined by the measured resistance of both circuits. A first circuit resistance is measured during the positive half cycle of the AC power line, and a second circuit resistance is measured during the negative half cycle. The requirement that the resistance be measured in the negative half cycle for the second circuit has, in turn, led to a requirement that conduction of the triac be determined both as to when power should be applied and when power should not be applied. Conductance of the triac when the power should not be applied is indicative of a triac short. Triacs can be shorted for either the positive or negative half cycles of the AC line, or even for both cycles. For single circuit and multiple circuit heating pads, the omission to detect AC switch failure for either half cycle may lead to the power generated during that cycle being applied to the heating element, and cause overheating.

The same principles apply generally to other types of the electronic AC switches, e.g., MOSFET based AC switches, BJT based AC switches, thyristor based AC switches, triac equivalents, etc.

With an appropriate circuit arrangement, the MCU can detect failures and shut down the circuit under certain abnormal conditions, such as overheating, a wire break, or when the triac fails short.

With reference to FIG. 1, which illustrates generally a conventional circuit, MCU U1 triggers triac Q1 to energize heating element or heater HT1 in response to a reading of a temperature sensor (not shown). MCU U1 periodically stops the trigger pulses to evaluate the condition of triac Q1. A Triac Detector circuit 10 comprising a transistor Q2, reverse voltage protection diode D3, current limiting resistor R2 and a load resistor R1, detects the presence of voltage on an MT2 terminal of triac Q1, and outputs a low level to the MCU when voltage is present, and a high level when there is no voltage (triac conducting). The MCU compares the response of the triac detector circuit to the current status of a control signal (trigger) of triac Q1. If the control signal is present, and the triac is expected to conduct current, the MCU expects a high level from the detector. When there is no control signal, the MCU expects a low level from the detector, during the positive half cycle of the power line voltage. Triac short failure is detected when the MCU receives the high level while the triac is not triggered. When such failure is detected, the MCU triggers the crowbar circuit, comprising a triac Qc and a current limiting resistor Rlim, which blows Fuse F1 and disconnects heater HT1 from the power line.

While useful, the circuit of FIG. 1 is not responsive to a negative voltage at MT2 terminal of triac Q1. The triac has both negative and positive switching facilities (for positive and negative half cycles of the power line) that can fail independently. However, the circuit of FIG. 1 does not protect against the short failure of the negative half cycle control part of triac Q1. Thus, there is a need to provide detection of the triac failure for both the positive and negative half cycles of the power line.

OBJECT AND SUMMARY OF THE DISCLOSURE

It is, therefore, an object of the disclosure to provide circuitry for an appliance utilizing a heating element powered from an AC power supply, that detects a short in a solid state switch, such as a triac, in both the positive and negative half cycle of the AC power supply so that an appliance utilizing a heating element powered by the positive half cycle and negative half cycle of the AC power supply will be protected from overheating, upon failure of the solid state switching element in either the positive or negative half of the AC cycle.

According to various aspects of the disclosure, a safety circuit is provided for use in disrupting power to a heating element of an appliance to be powered through a solid state switch, typically a triac, from an AC power source having a positive half cycle and a negative half cycle for delivering power. A low resistance condition is sensed by detecting either a current through, or absence of voltage across, the solid state switch during the positive half cycle and the negative half cycle of the AC power line, when the solid state AC switch is not actuated. A fault signal is generated to interrupt power to the heating element, preferably by a crowbar circuit opening a fuse, whenever the low resistance condition is detected.

In one embodiment, the solid state switch is selectively triggered to supply power to the heating element during only a predetermined number of cycles of the applied AC power source, thereby providing a duty cycle limited average to the load. A circuit interrupter in series with the heating element and solid state switch disrupts power to the heating element when a larger current is established, indicating that the solid state switch is passing more than the predetermined number of cycles to the heating element.

According to another embodiment, safety circuits for detecting either current through, or absence of voltage across, the solid state switch during the positive half cycle and negative half cycle of the AC power line, when a solid state AC switch is not actuated, provide a logical fault related signal to an MCU or other logical circuit, which actuates a circuit interrupter, e.g., a crowbar circuit, to disrupt power to the heating element.

In accordance with yet another embodiment, the safety circuits are used with an analog input of an MCU, providing simplified means for detecting either current through, or absence of voltage across, the solid state switch during the positive half cycle and negative half cycle of the AC power line, when a solid state AC switch is not actuated. When a fault condition is detected, the MCU actuates a circuit interrupter, e.g., a crowbar circuit, to disrupt power to the heating element. This embodiment is further adapted for use in a heating appliance with dual heating elements, each formed of a positive temperature coefficient flexible wire and being individually powered through a solid state switch by a respective half cycle of the AC power source, where the bi-polar current detection means are further utilized for independent temperature control of each of the positive half cycle and negative half cycle operated heating circuit.

According to still another aspect of the disclosure, there is provided a temperature control and safety circuit for detecting the temperature of a PTC heating element and the status of a solid state switch powered by an AC power source in both a positive and a negative power voltage half cycle. The circuit includes an AC-powered solid state switch, e.g., a triac, in series with a current sense resistor, the voltage drop across the resistor being proportional to current through the PTC heating element. The circuit also has a voltage shifting circuit for providing a positive voltage to an analog to digital converter during both a positive and a negative half cycle. Preferably, the voltage input to the analog to digital converter controls, at least in part, the temperature of the PTC heating element and the status of the AC-powered solid state switch during both of the positive and negative half cycles.

Alternatively or concurrently, the heating element is a dual circuit PTC wire heater having independent temperature control with one circuit powered by the positive half cycle and the other circuit powered by the negative half cycle. Further in the alternative or concurrently therewith, the analog to digital converter receiving the voltage input is part of a microcontroller. Optionally, the microcontroller receiving a solid state switch short circuit status in either the positive or negative half cycle activates a crowbar circuit to open a fuse so as to permanently interrupt current through the heating element.

These and other objects, features and advantages of the disclosure are provided by a safety circuit that detects a short in either the positive or negative half cycle of the solid state switching element to initiate a crowbar circuit for increasing current to the fuse through which AC power is supplied to the appliance to open the fuse.

Figure 1:
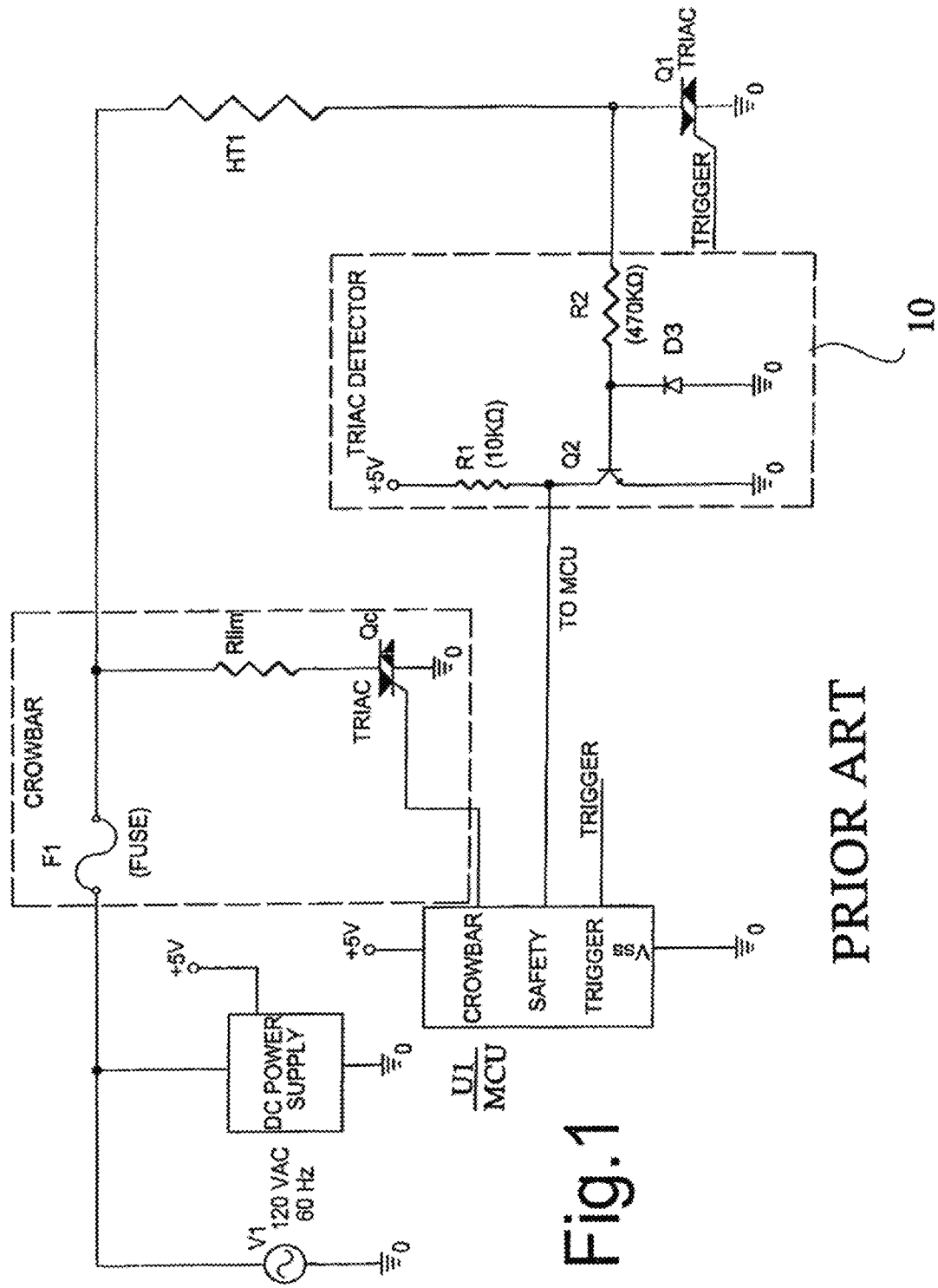
FIG. 1 is a diagram of a conventional circuit for AC switch failure detection, limited to the positive half cycle.

Still other objects and advantages of the disclosure will become apparent from the following description.

DETAILED DESCRIPTION

Referring now to the drawings and, more particularly, to FIGS. 2-15, there is shown generally a specific, illustrative bi-polar triac short detection and safety circuit, according to various aspects of the disclosure. In one embodiment, illustrated generally in FIG. 2, triac detection circuitry 12 detects a short during either half cycle of AC power controlled by a triac to a heating device. A PNP transistor Q3 provides a required negative voltage detection capability. This bi-polar voltage detector operates as follows. When the triac, Q1, is conducting, the voltage drop across the triac is below about 1 Vrms. This voltage is too small to turn on switch Q2. Voltage divider R3 R5 maintains Vbe of Q3 at about 0.15V, which keeps switch Q3 off as well. In this condition, detector output is high. When positive line voltage is present, switch Q2 turns on, and the detector output is low. Diode D2 protects the base of switch Q3 from reverse voltage. When negative line voltage is present, switch Q3 turns on, as does switch Q2; the detector output being low.

Figure 2:
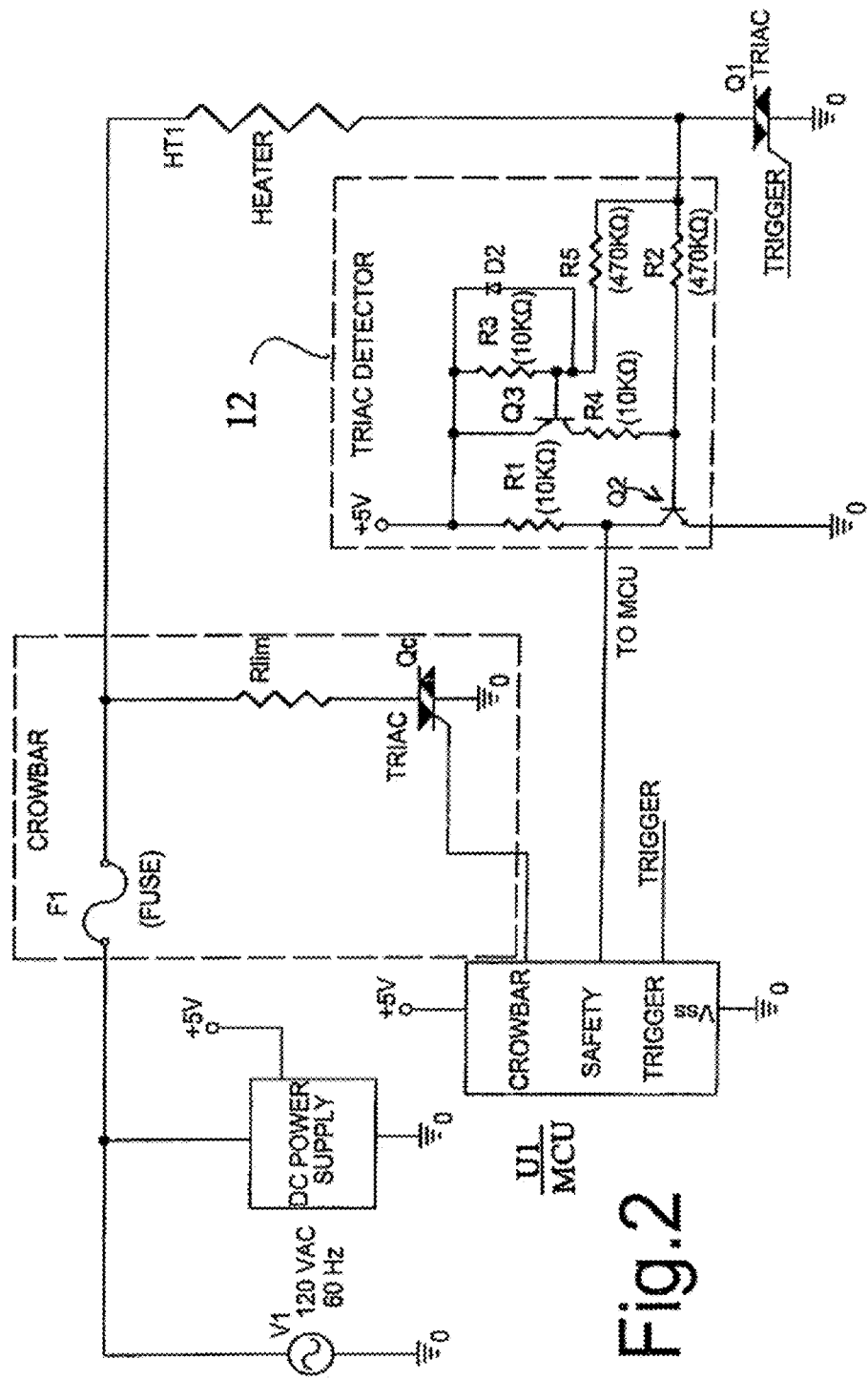
FIG. 2 is a circuit diagram for AC switch failure detection for both AC half cycles by sensing a voltage drop across a solid state switching device, according to one aspect of the disclosure.
Figure 3:
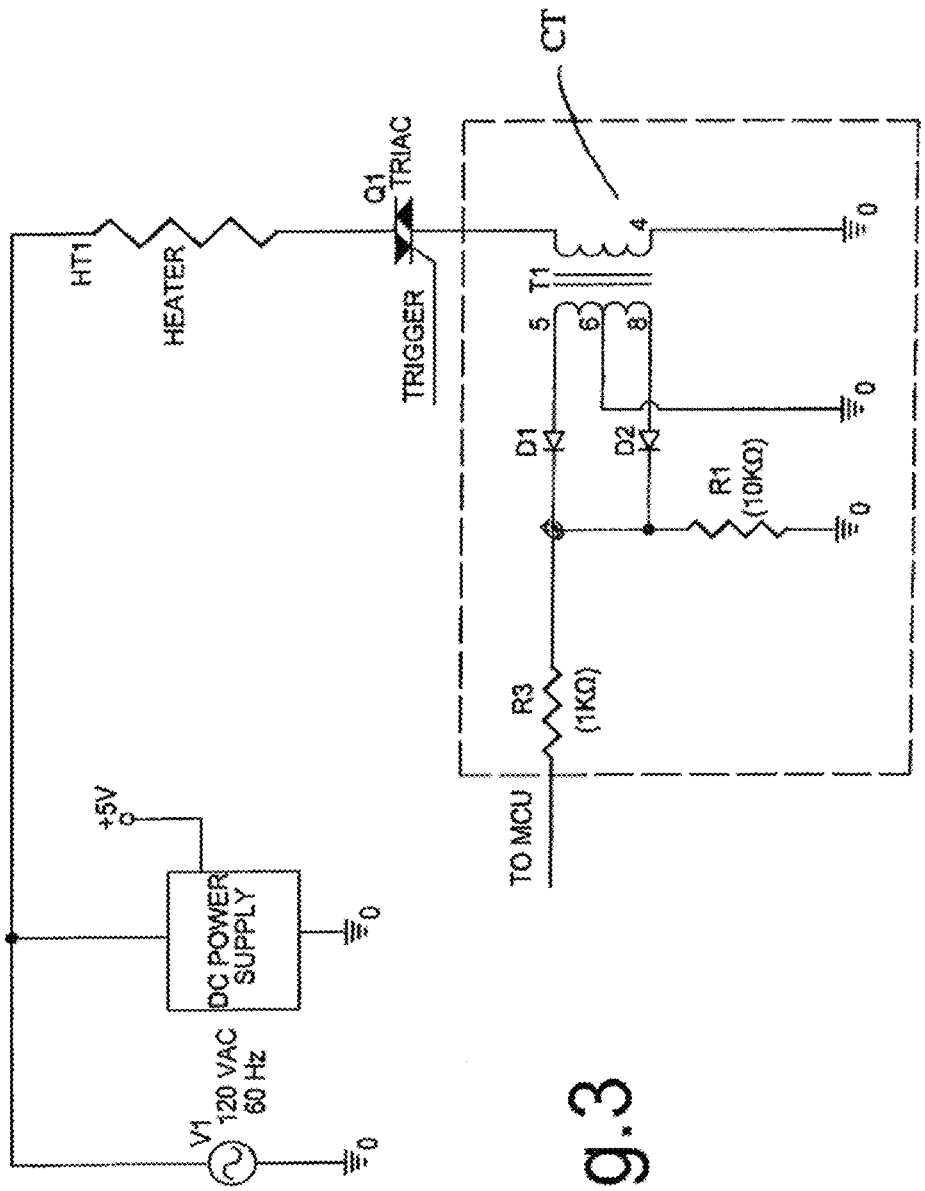
FIG. 3 is a circuit diagram for AC switch failure detection during both AC half cycles by sensing current through a solid state switching device, in accordance with another aspect of the disclosure.

The detector of FIG. 2 detects triac conduction based on voltage drop across the triac.

Another way to detect triac conduction, according to the disclosure, is based on sensing current passing through the triac. The circuit of FIG. 3, for example, shows such a detector, which utilizes a current transformer (CT). This circuit outputs a positive voltage to the MCU when triac Q1 is conducting on either the positive or negative half cycle of the AC power line voltage. In general, the voltage is proportional to the magnitude of current passing through the triac. A CT turn ratio is selected so that the nominal current through the triac creates voltage on the output of the detector corresponding to the high logic level. Resistor R3 limits input current of the MCU at current spikes.

Figure 4:
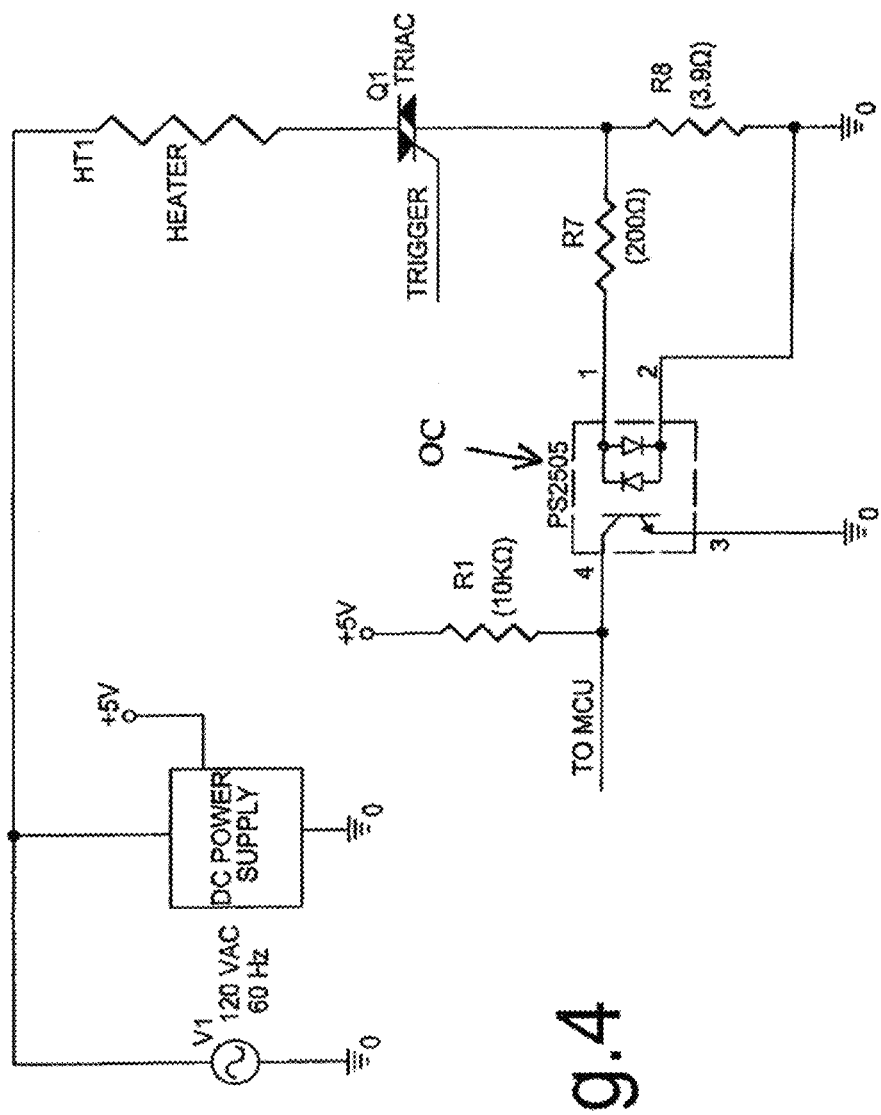
FIG. 4 is a circuit diagram of an alternative circuit for AC switch failure detection during both AC half cycles.

Alternatively or concurrently, an AC optocoupler (OC) enabled circuit, as shown in FIG. 4, provides bi-polar detection of triac Q1 current based on a voltage drop across current sense resistor R8. The output of the circuit is high when the triac is off, and goes low when any polarity current is detected. The values on the schematic correspond to a heater current of about 0.5 Amp.

Figure 5:
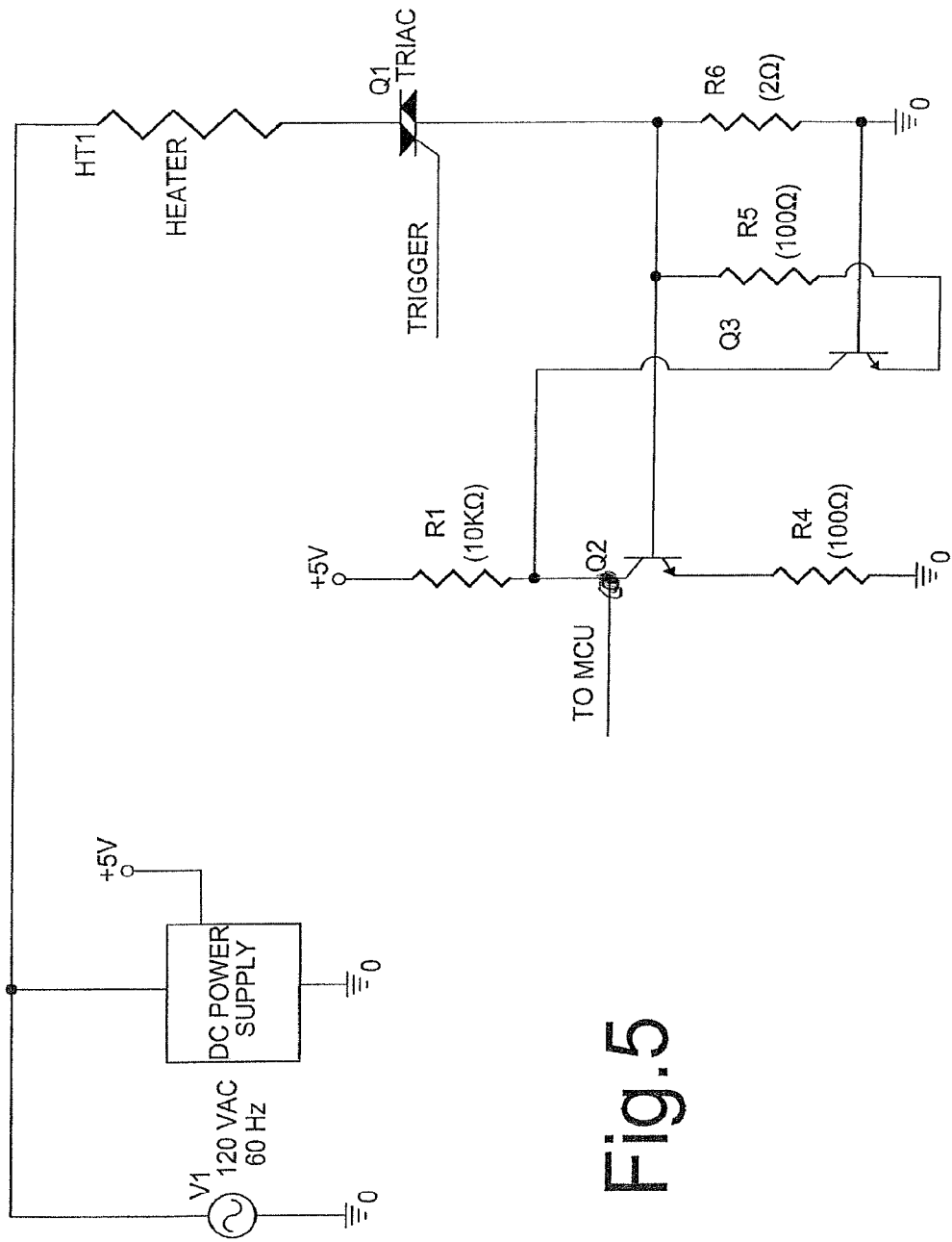
FIG. 5 is a circuit diagram for another alternative circuit for the AC switch failure detection during both AC half cycles.
Figure 6:
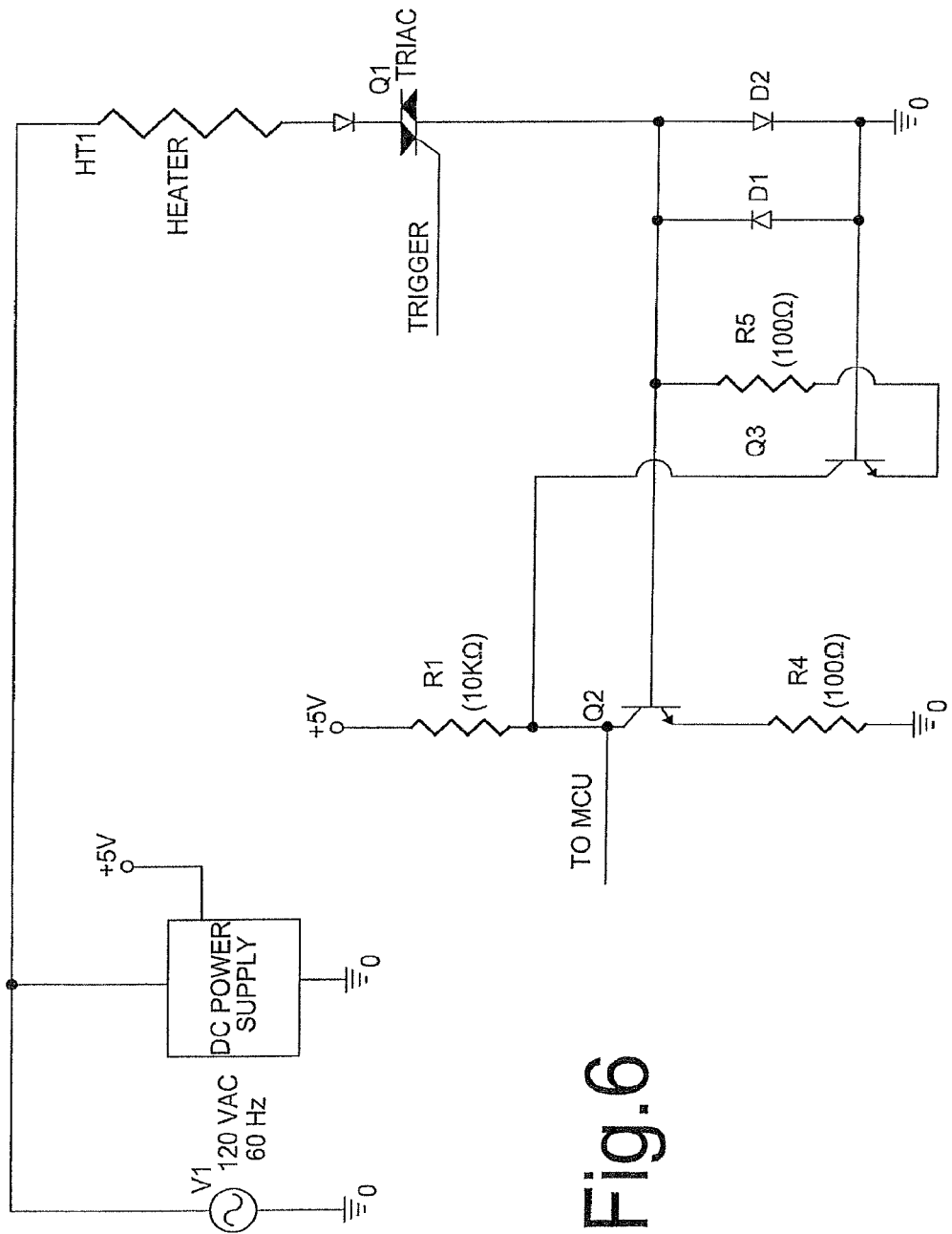
FIG. 6 is a circuit diagram directed to an arrangement for controlling power to a heating element from an AC power source during both AC cycles, according to a further aspect of the disclosure.

Further in the alternative or concurrently therewith, a simple and inexpensive bi-polar current detector is presented according to FIG. 5. This current detector comprises two NPN switches Q2 and Q3 sharing load resistor R1. The output of the circuit is high, when the triac is off. Positive current through a current sense resistor R6 turns switch Q2 on, at which point the output goes low. The output also goes low, when negative current through resistor R6 turns switch Q3 on. Resistors R4 and R5 limit the base currents of the corresponding transistors. The current sense resistor R6 value on the schematic corresponds to a heater current of about 0.5 Amp. The current sense resistor of the circuit of FIG. 5 dissipates about half of the heat of the current sense resistor, according to FIG. 4.

Optionally, an inductor or a capacitor may be used in place of the current sense resistor of FIGS. 4 and 5 to reduce heat generated by the current sense component. To further reduce heat, and make the circuit work on a wide range of currents, the circuit of FIG. 6 uses a pair of inversely paralleled diodes D1 and D2 in place of a current sense resistor.

Generally speaking, the circuits discussed up to this point are designed to work with digital inputs of an MCU or any logic driven protection circuit. Having an analog input available opens up other opportunities for bi-polar voltage and current detection. An on-board or external A-to-D converter (ADC) or a pair of on-board or external analog comparators may be used as an analog input of the MCU or any other logic driven protection circuit.

Figure 7:
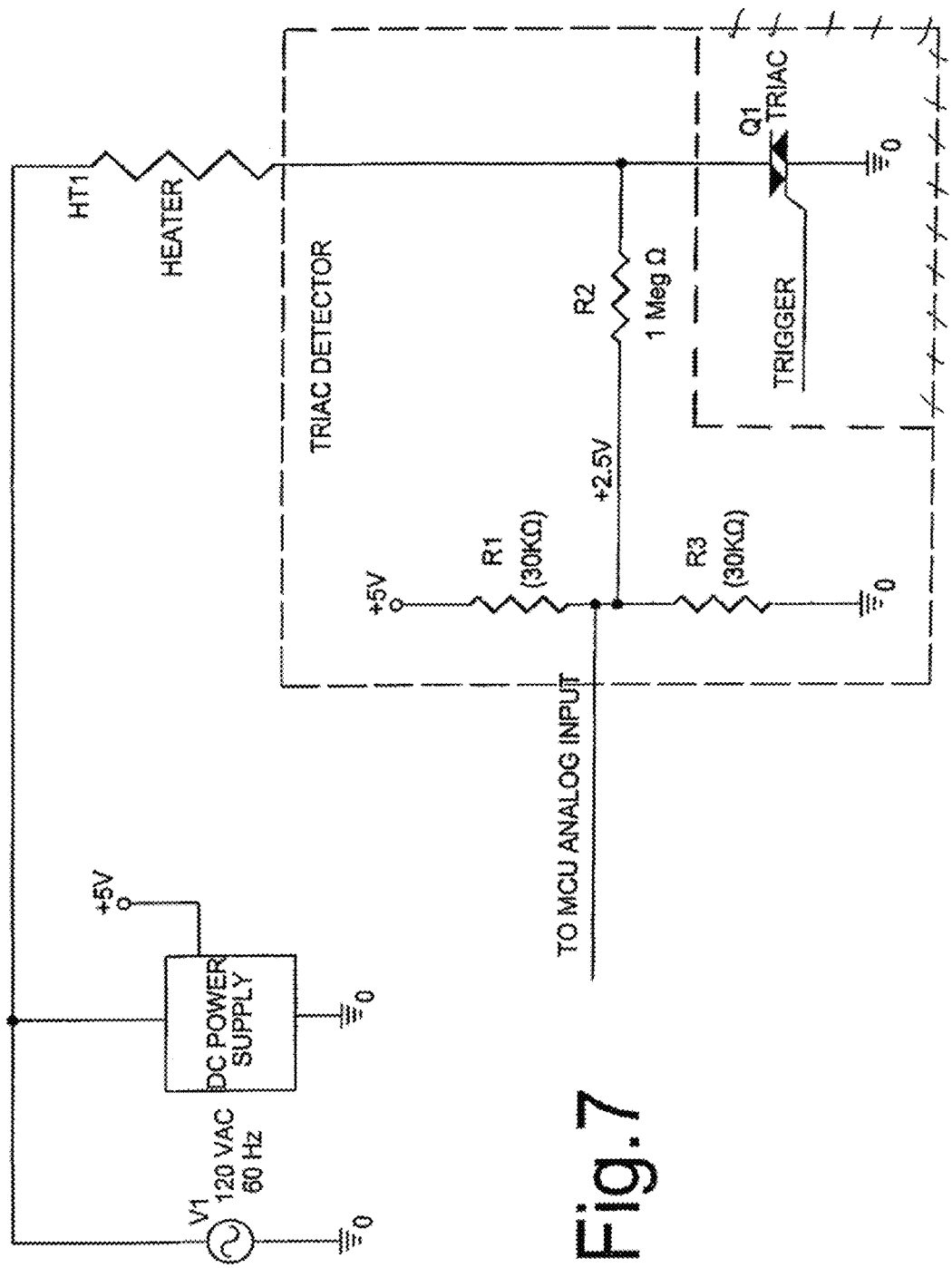
FIG. 7 is a diagram relating to a circuit for AC switch failure detection during both AC half cycles by using analog inputs, in accordance with yet another aspect of the disclosure.
Figure 8:
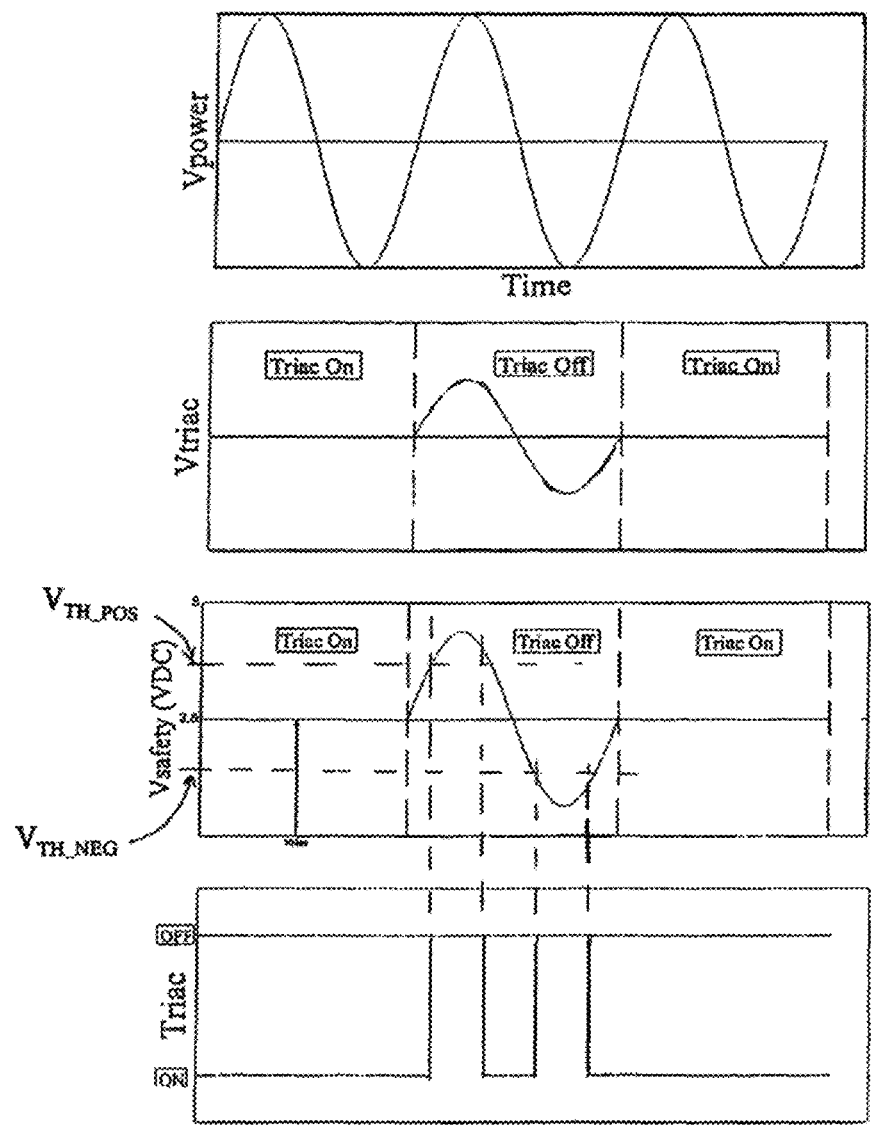
FIG. 8 illustrates the relation of the input analog signals to the logical signals in the MCU of the circuitry shown in FIG. 7.

With analog input, the voltage detector circuit of FIG. 2 can be transformed into a simple arrangement as set forth in FIG. 7. Voltage divider R1 R3 provides a bias for the analog input of the MCU. Resistor R2 together with the bias network forms a voltage divider that scales down the power voltage. As shown in FIG. 8, a voltage comparator or an ADC of the MCU detects the status of triac Q1.

Figure 9:
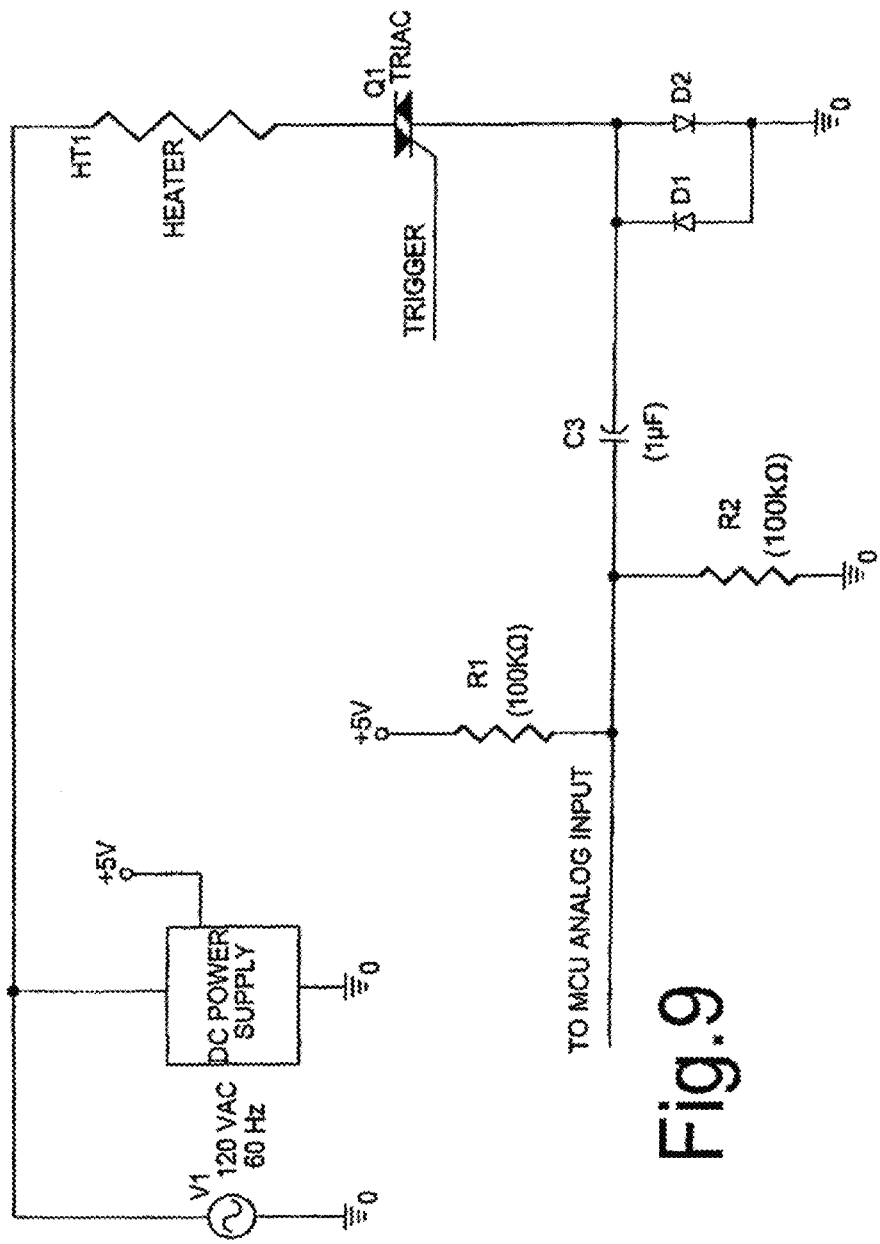
FIG. 9 is a circuit diagram directed to an alternative circuit for AC switch failure detection during both AC half cycles by using analog inputs.
Figure 10:
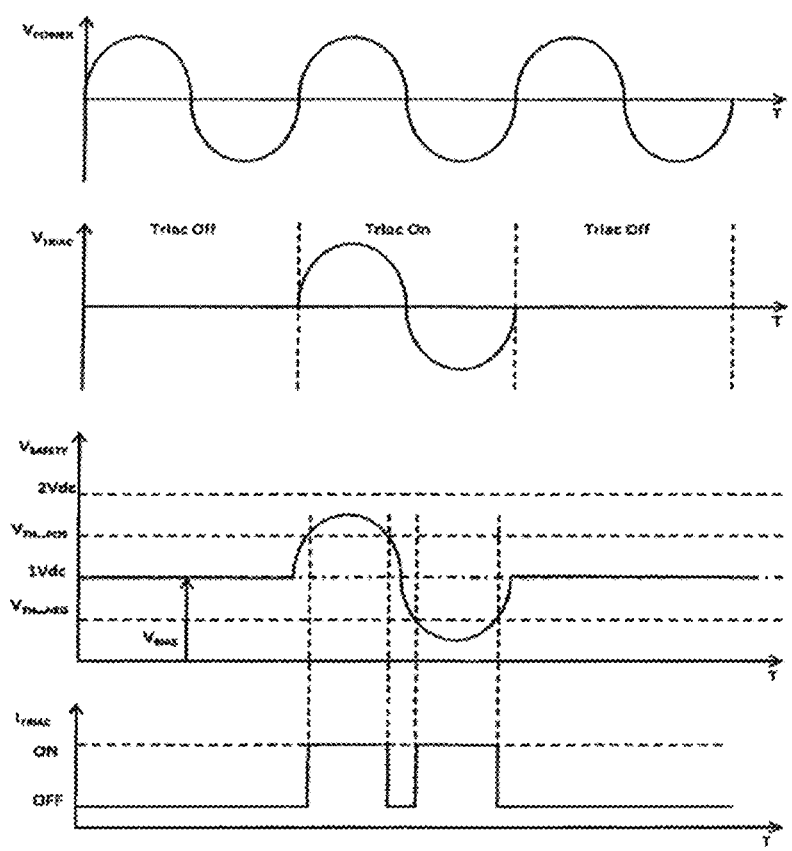
FIG. 10 illustrates signals generated according to the circuit of FIG. 9.

FIG. 9 depicts a bi-polar current detector version for an MCU with an analog input. This circuit features a voltage divider R1 R2 that sets the bias at 1 V, and a DC blocking capacitor C3. A voltage comparator or an ADC of the MCU detects the status of triac Q1, as shown in FIG. 10.

Figure 11A:
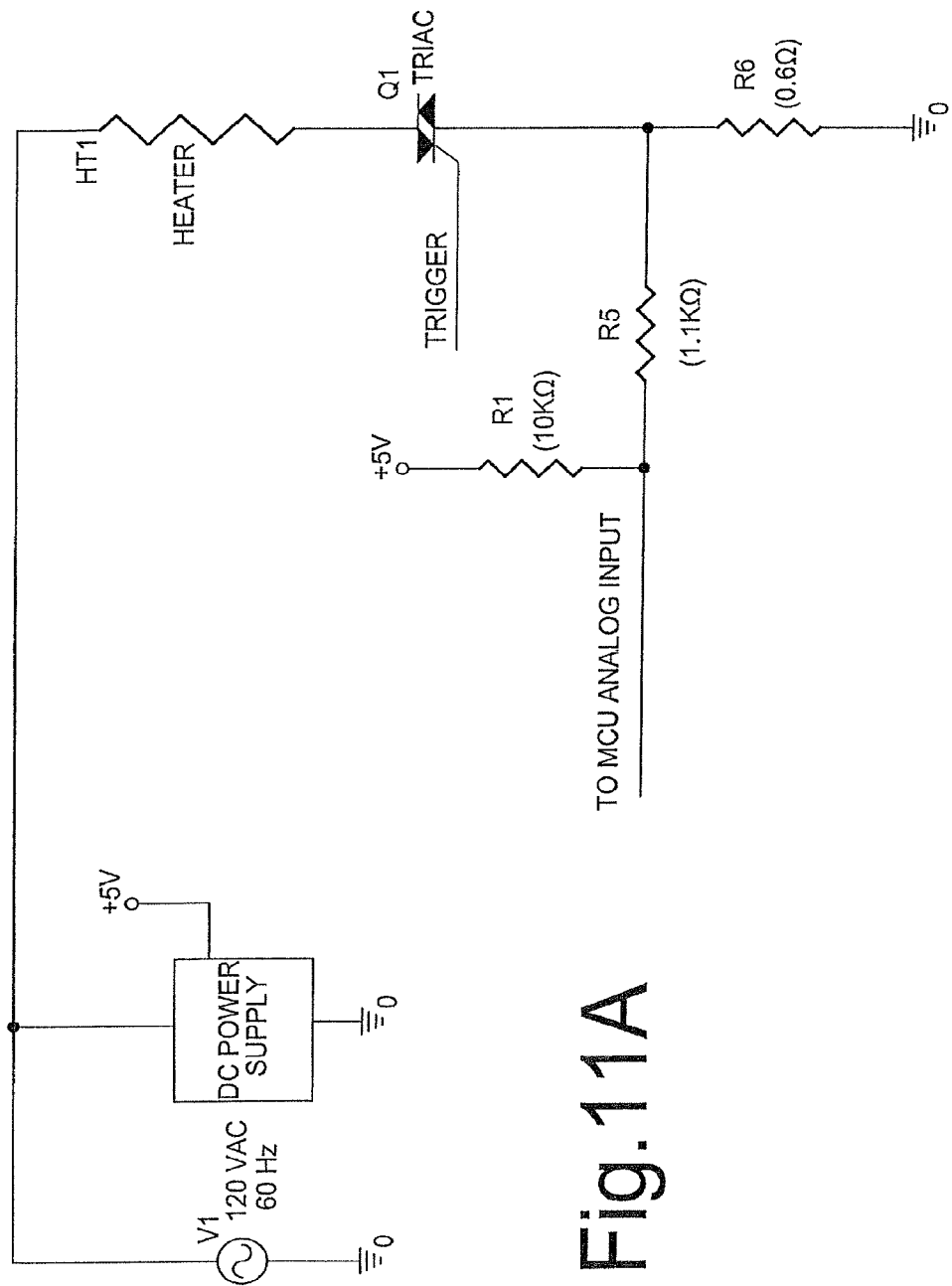
FIGS. 11A and 11B are circuit diagrams relating to a further alternative circuit for controlling power to a heating element from an AC power source during both AC half cycles by analog inputs.
Figure 11B:
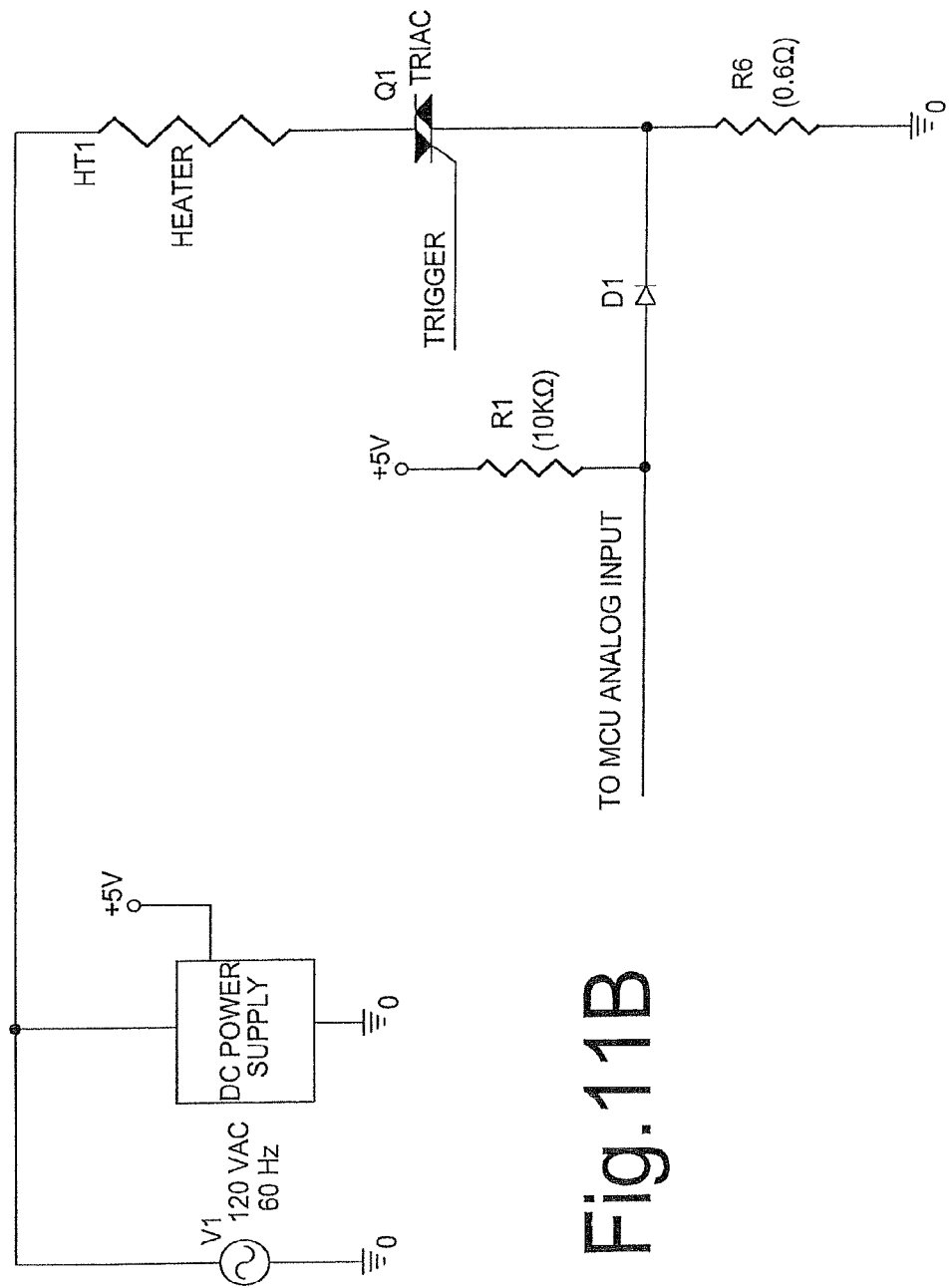

The two circuits shown in FIGS. 11A and 11B demonstrate yet another version of the bi-polar current detector working in conjunction with an analog input of the MCU. Both circuits feature a small value current sense resistor and a bias circuit that shifts a zero at the MCU input up by about 500 mV. The value of the current sense resistor is selected for a heater current of about 0.5 Amp. The circuits work similarly to the detector of FIG. 9.

Bi-polar current detection circuits according to FIGS. 11A and 11B can be used to control the temperature of a heating pad having a heating element by using a positive temperature coefficient (PTC) wire that changes its resistance with temperature. In this manner, bi-polar detection capability enables independent temperature control of each circuit of the dual circuit heating pad, where one circuit is powered by a positive half cycle of the power line, and another circuit by the negative half cycle. An example of such controller is shown in FIG. 12.

Figure 12:
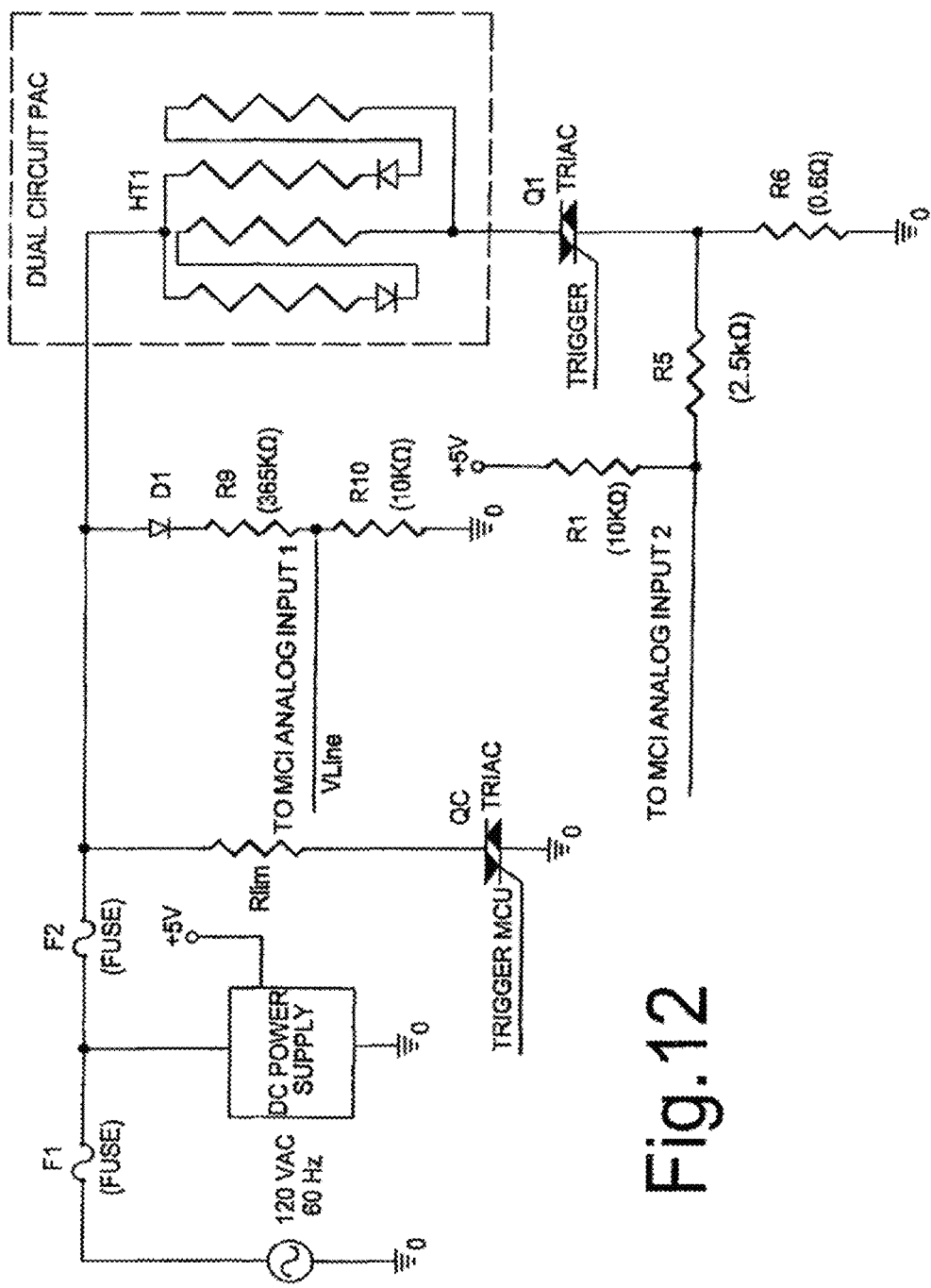
FIG. 12 is a circuit diagram illustrating a preferred circuit for AC switch failure detection during both AC half cycles in a dual circuit heating pad controller, in accordance with still a further aspect of the disclosure.
Figure 13:
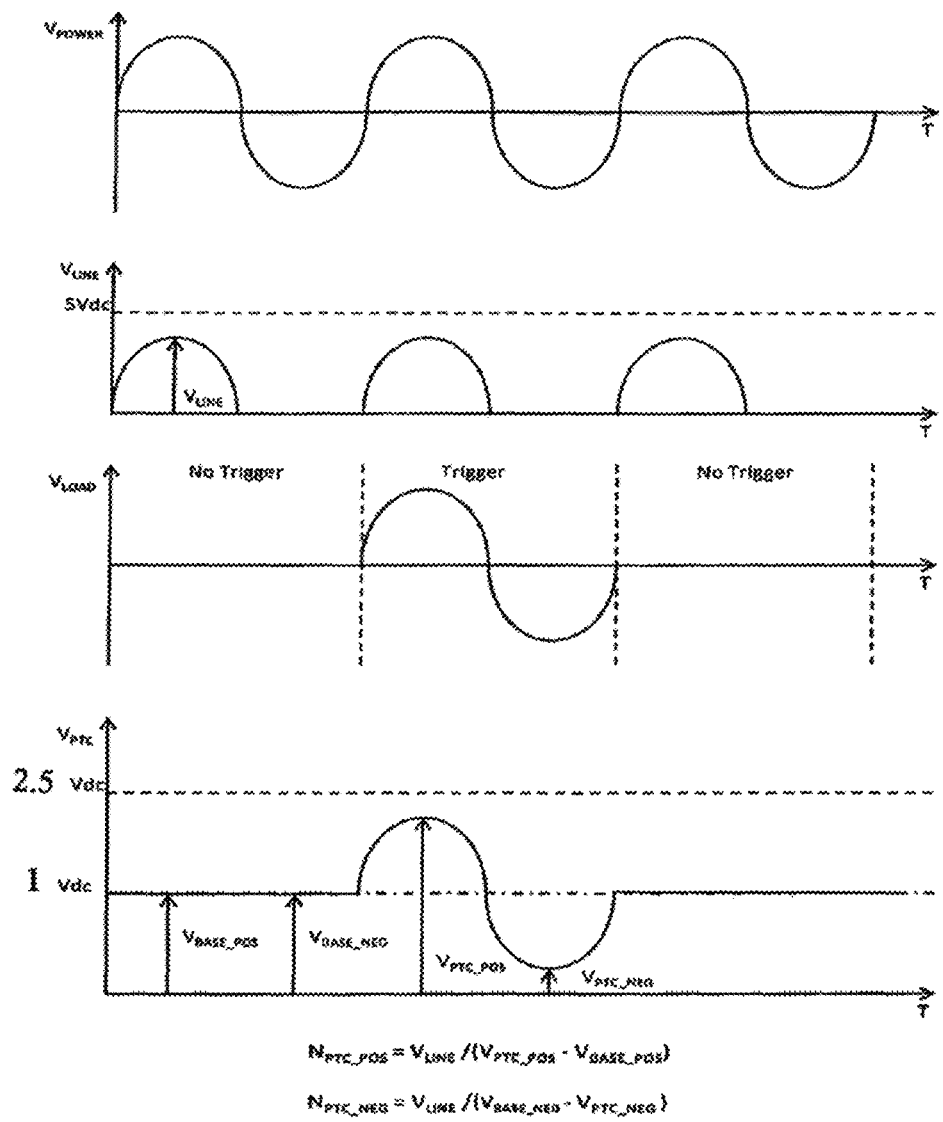
FIG. 13 shows signals produced by the circuit of FIG. 12.

The circuit of FIG. 12 preferably uses an MCU (not shown) that employs an ADC to measure a voltage drop across current sense resistor R6 during the positive and negative half cycles of the AC power line ($V_{PTC\_POS}$ and $V_{PTC\_NEG}$) to a dual circuit heating pad. The MCU also measures the power line voltage scaled down by a voltage divider R9 R10. To increase resolution, in this example, the line voltage $V_{LINE}$ IS measured as amplitude of the positive half cycle, taking advantage of the symmetrical nature of the AC power line. The MCU uses the measurements to evaluate heating wire temperature for the positive and negative half cycle operated parts of the heating element independently, as set forth in FIG. 13. Resistance of the positive and negative halves of the heating element is measured as ratios of the power line voltage measurement to the amplitude of a corresponding half cycle measurement of the voltage drop across the current sense resistor. The resulting values, that directly correspond to the temperatures of the positive and negative halves of the heating element, are compared to a preset level, and if the preset level is reached, the heating element part of the corresponding polarity is turned off for the duration of the heating period that immediately follows.

The $V_{BASE\_POS}$ and $V_{BASE\_NEG}$ voltage measurements are taken by the MCU when the triac is off to evaluate proper operation of the positive and negative halves of the triac, and also to remove the power supply ripple effect on the temperature measurements. If either $V_{BASE\_POS}$ and $V_{BASE\_NEG}$ voltage departs from a known DC offset for more than the allowed preset value, then the MCU detects a triac Q2 failure, and activates crowbar circuit Q1 R2 to blow fuse F2 and disconnect the heating element from the power supply. This arrangement provides protection not only from a short in any half of the triac, but also in the event of excessive leakage current through the triac.

The same circuit arrangement can be used with a single circuit heating element comprising PTC wire. In this case, the negative half cycle resistance reading may be additionally used to improve accuracy of the measurement and to assess the condition of the negative part of the AC switch (triac).

The same circuit arrangement can further be used with a multiple circuit heating element comprising PTC wire, where the heating element circuits are sequentially connected (one at a time) to the control circuit for resistance measurements by an additional switching circuit. Through this arrangement, the control circuit may provide condition evaluation for all AC switches in the heating element operation circuitry.

For the non-PTC types of AC powered heating elements, or when other techniques are used to control heating element temperature, the circuits of FIG. 2-9, FIG. 11A and FIG. 11B provide positive detection of AC switch failure for both positive and negative halves of the switching structure.

When no crowbar circuit is available, and/or no logic driven protection circuitry is used, a Duty Cycle Protection method, according to the disclosure, provides adequate protection from a short circuit failure of either part of the AC switching element.

Figure 14:
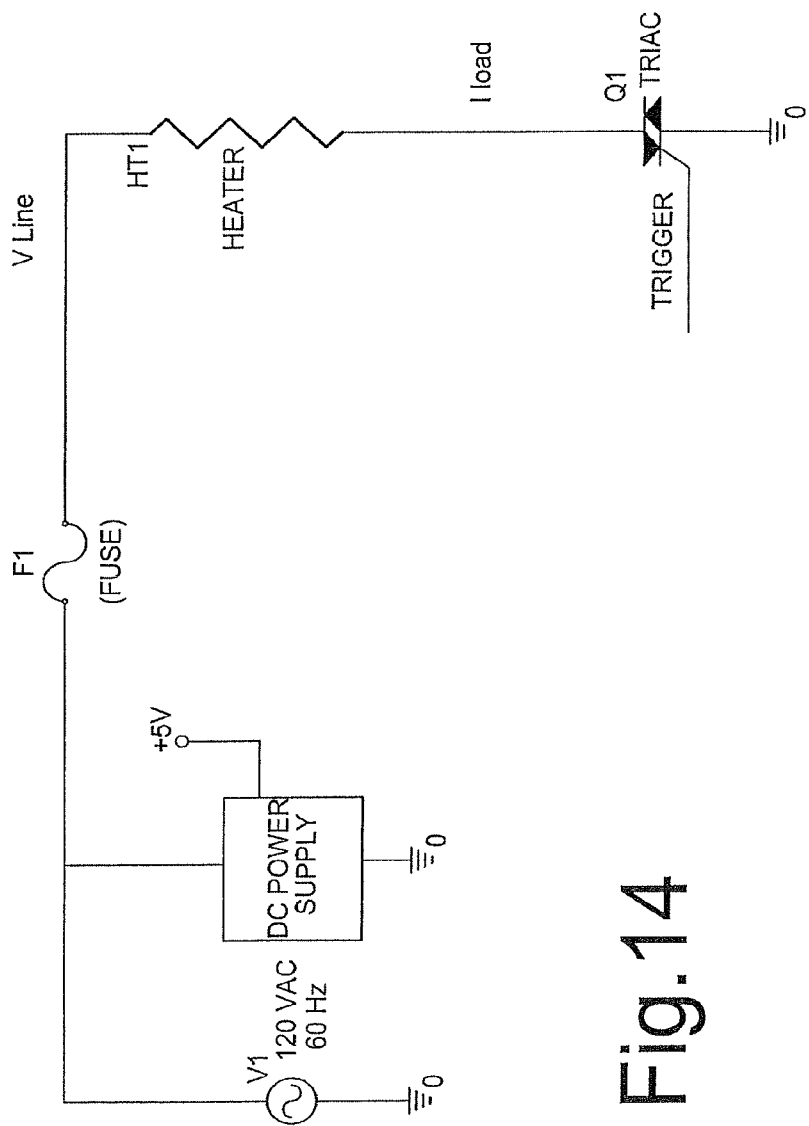
FIG. 14 is a circuit diagram for duty cycle enabled protection responsive to AC switch failure at either half cycle.
Figure 15:
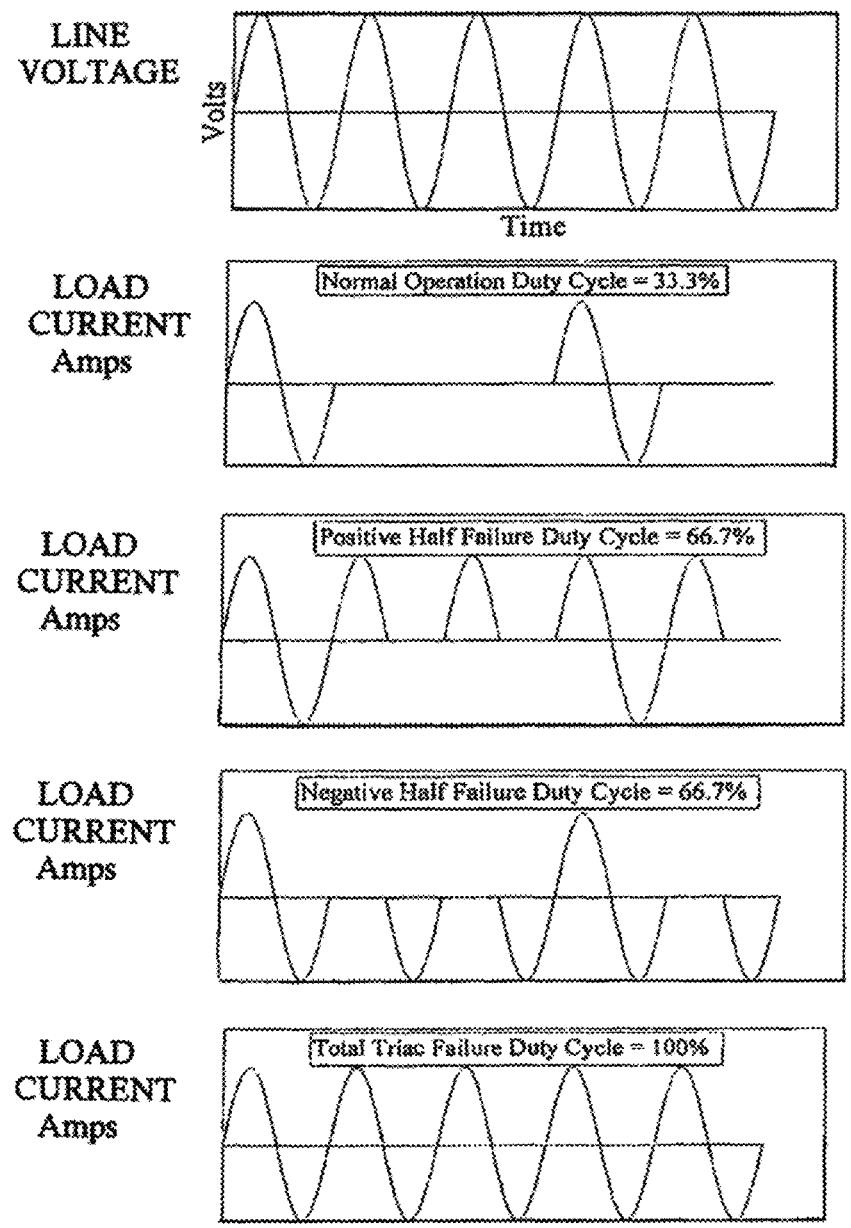
FIG. 15 illustrates signals generated by the circuit of FIG. 14.

In general, Duty Cycle Protection is a passive technique which provides adequate electronic AC switch failure protection without the use of extra active components or sophisticated algorithms. The hardware arrangement is shown in FIG. 14. The principle of operation is demonstrated by diagrams of FIG. 15. More particularly, under normal working conditions, triac Q1 is triggered every third cycle of the power line voltage. Heating element HT1 is constructed so as to provide adequate power at a 33.3% duty cycle. Fuse F1 is sized to allow continuous operation at an average current corresponding to the 33.3% duty cycle, and blow, when the current is exceeded by more than about 15%. If either the positive or negative half of the triac fails due to a short, the average current doubles as the duty cycle goes to 66.7%, and fuse F1 blows. If both halves of the triac fail due to a short, the average current triples, and fuse F1, in turn, blows even faster.

Overall, the bi-polar temperature control and/or AC switch protection mechanisms, as described above, can be used on any AC powered devices, where complete or partial failure of the AC switch may lead to a dangerous situation or undesired performance. Examples of such devices include, but are not limited to, motor controls, light controls, microwave ovens, conventional ovens, etc.

The AC switch may comprise, for instance, a triac, a triac equivalent, a MOSFET AC switch, a thyristor based AC switch, a solid state relay, or any other electronic circuit capable of controlling AC power in response to the control signal.

It is noted that in the above-described circuits, an inductor or a capacitor may be used in place of the resistor to measure current. As known by those skilled in the art, differing sources of impedance would suffice.

Also, it is understood that other arrangements of voltage and current based AC switch failure detection circuits may be employed by those skilled in art to provide detection of the positive and negative halves of the AC switch, without departing from the scope and spirit of this disclosure.

The embodiments herein described are provided for the purpose of illustration and not limitation of the disclosure. Various modifications and alterations may be appreciated based on a review of this disclosure. These changes and additions are intended to be within the scope and spirit of the disclosure as defined by the following claims.

What is claimed is:

1. A temperature control and safety circuit for detecting the temperature of a PTC heating element and the status of a solid state switch powered by an AC power source in both a positive and a negative power voltage half cycle, the circuit comprising:

an AC-powered solid state switch in series with a current sense resistor, the voltage drop across the resistor being proportional to current through the PTC heating element; and a voltage shifting circuit for providing a positive voltage to an analog to digital converter during both a positive and a negative half cycle, wherein the voltage input to the analog to digital converter controls, at least in part, the temperature of the PTC heating element and the status of the AC-powered solid state switch during both of the positive and negative half cycles.

2. The temperature control and safety circuit set forth in claim 1, wherein the solid state switch is a triac.

3. The temperature control and safety circuit set forth in claim 2, wherein the heating element is a dual circuit PTC wire heater having independent temperature control with one circuit powered by the positive half cycle and the other circuit powered by the negative half cycle.

4. The temperature control and safety circuit set forth in claim 1, wherein the analog to digital converter receiving the voltage input is part of a microcontroller.

5. The temperature control and safety circuit set forth in claim 4, wherein the microcontroller receiving a solid state switch short circuit status in either the positive or negative half cycle activates a crowbar circuit to open a fuse so as to permanently interrupt current through the heating element.

\* \* \* \* \*